United States Patent
Altekrüger et al.

(10) Patent No.: US 6,277,192 B1
(45) Date of Patent: *Aug. 21, 2001

(54) CRYSTAL PULLING UNIT

(75) Inventors: Burkhard Altekrüger; Joachim Aufreiter, both of Alzenau (DE)

(73) Assignee: Leybold Systems GmbH (DE)

( * ) Notice: Subject to any disclaimer, the term of this patent is extended or adjusted under 35 U.S.C. 154(b) by 0 days.

This patent is subject to a terminal disclaimer.

(21) Appl. No.: 09/274,016

(22) Filed: Mar. 22, 1999

(30) Foreign Application Priority Data

Mar. 26, 1998 (DE) .............................. 198 13 453

(51) Int. Cl.⁷ .................................................. C30B 15/02
(52) U.S. Cl. ..................................................... 117/18
(58) Field of Search ............................. 117/13, 18, 214, 117/216

(56) References Cited

U.S. PATENT DOCUMENTS

| 4,904,143 | 2/1990 | Drechsel et al. | 414/217 |
| 4,968,380 | 11/1990 | Freedman et al. | 156/608 |
| 5,229,082 | 7/1993 | Seidensticker et al. | 422/249 |
| 5,242,531 | 9/1993 | Klingshirn et al. | 156/620 |
| 5,324,488 | 6/1994 | Klingshirn et al. | 117/213 |
| 5,580,171 | 12/1996 | Lim et al. | 366/336 |
| 5,900,055 | * 5/1999 | Nagaietal | 117/33 |

FOREIGN PATENT DOCUMENTS

| 4106589 | 9/1992 | (DE) . |
| 0314858 | 5/1989 | (EP) . |
| 0771891 | 5/1997 | (EP) . |
| 2240287 | 7/1991 | (GB) . |

OTHER PUBLICATIONS

Patent Abstracts of Japan, No. 07118089 (Komatsu Electron Metals Co. Ltd.), May 9, 1995.
Patent Abstracts of Japan, No. 09227271, (Shin Etsu Handotai Co. Ltd.), Sep. 2, 1997.
Patent Abstracts of Japan, No. 07265684, (Komatsu Electron Metals Co. Ltd.), Oct. 17, 1995.
Patent Abstracts of Japan, No. 07118089, May 9, 1995.
Patent Abstracts of Japan, No. 59008694, Jan. 17, 1984.
Patent Abstracts of Japan, No. 03008791, Jan. 16, 1991.

* cited by examiner

*Primary Examiner*—Felisa Hiteshew
(74) *Attorney, Agent, or Firm*—Smith, Gambrell & Russell, LLP

(57) ABSTRACT

A crystal pulling unit for the production of a crystal block has a recharging tube (7), via which granulate (17) enters into a crucible (2) with a melt (3), located within a container (1). This recharging tube (7) has an annular space (20) between an inner wall (18) and an outer wall (19), which is open on the lower front side of the recharging tube (7) and is connected with the protective gas source (13) to supply protective gas. This protective gas cools the recharging tube (7) and around its outlet, forms a gas mist that prevents the entry of finer fractions of the charging material into the pulling space.

23 Claims, 2 Drawing Sheets

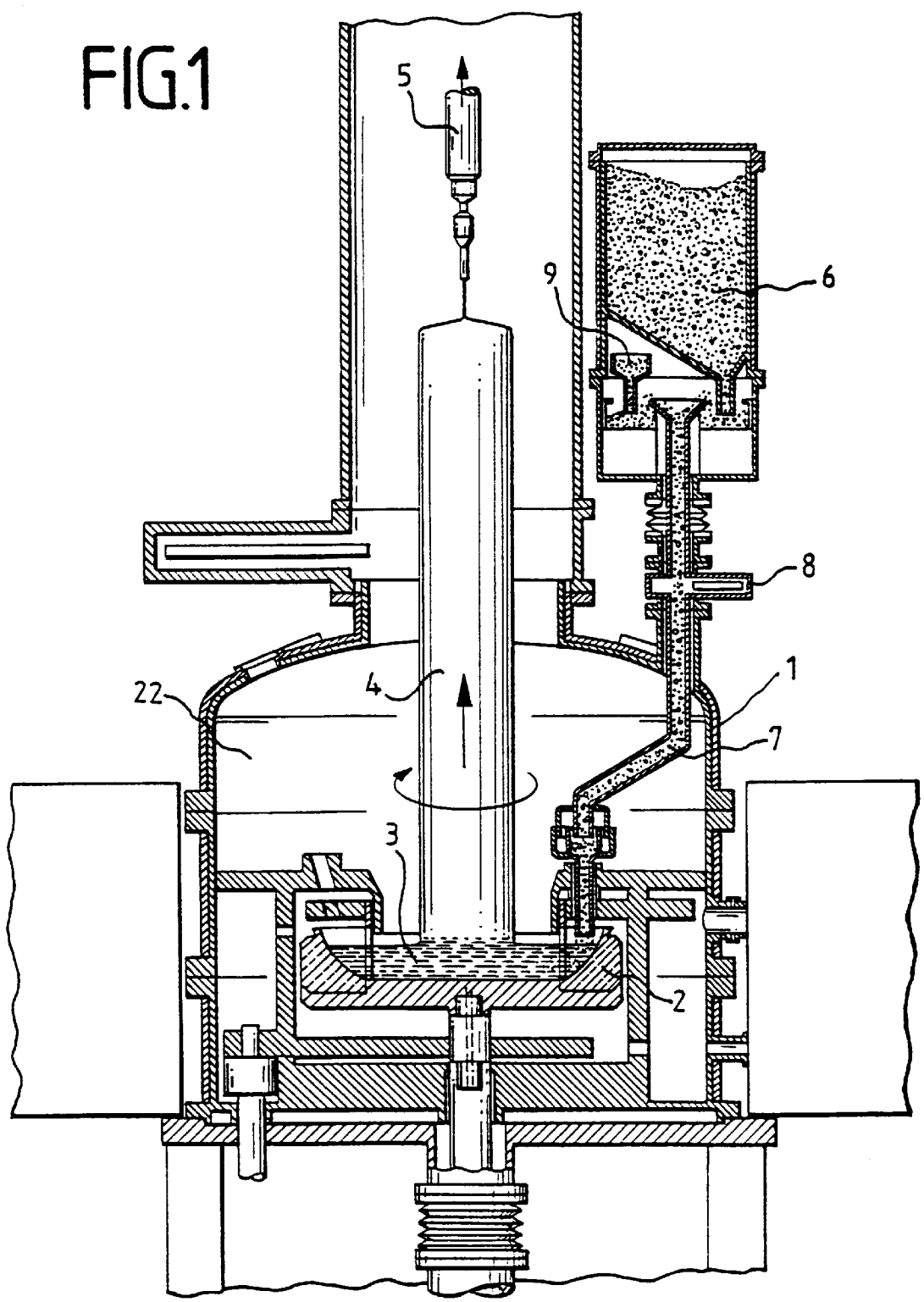

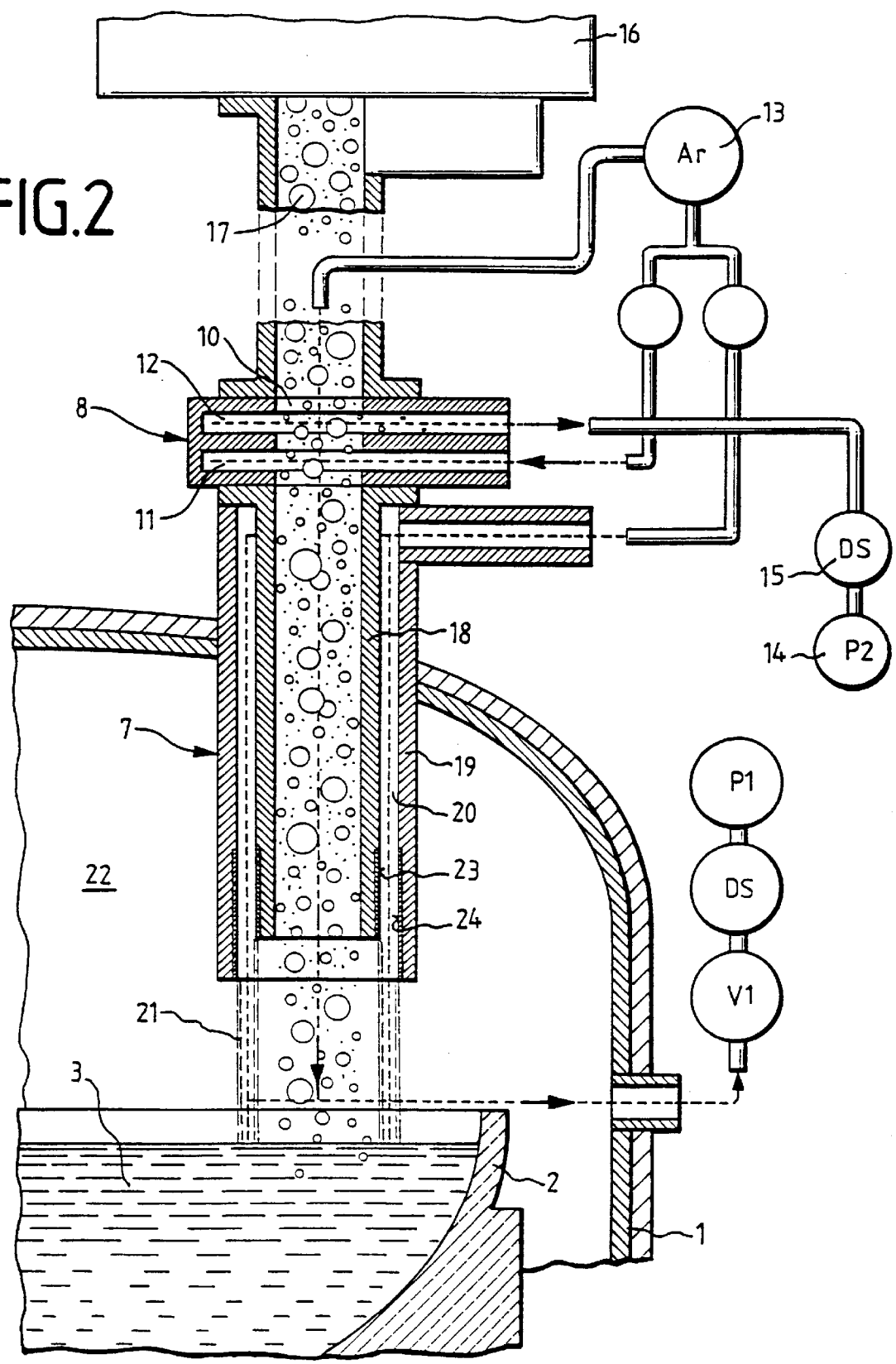

CRYSTAL PULLING UNIT

INTRODUCTION AND BACKGROUND

The present invention relates to a crystal pulling unit for the production of a crystal block, which includes a crucible for the meltable material forming the crystal block and which further includes a recharging tube leading to the crucible to supply the meltable material in granulate form.

Crystal pulling units that are generally of the aforementioned type are known for the pulling of crystal blocks from semiconductor material using the Czochralski method. These units mostly work continuously in that during the pulling of the crystal block, the meltable material which ultimately forms the melt is constantly supplied in the form of a granulate. Reference is made to German Patent No. 2,821,481 as an example of the state of the art which is incorporated herein by reference. Comparable crystal pulling units are, however, also used for semi-continuous Czochralski pulling methods. The recharging tube is made of quartz material, as is the crucible.

While operating such crystal pulling units, one often finds that clogging occurs in the recharging tube. If that happens, the unit must be brought to a standstill, causing interruption of the process which generates relatively higher costs. Another disadvantage of known crystal pulling units lies in the fact that when finer granulate fractions impact on the liquid level of the melt in the crucible, these fractions "dance" on the liquid level, instead of melting, and in this way enter the pulling space above the melt and contaminate it.

It is therefore an object of the present invention to design a crystal pulling unit of the type discussed above in such a way that the danger of clogging in the recharging tube is as small as possible, and that fine-grain fractions are not able to pass over into the pulling space above the liquid level.

SUMMARY OF THE INVENTION

The above and other objects of the present invention can be achieved by designing the recharging tube to have an annular space between an inner wall and an outer wall. More particularly, it is a feature of the invention that this annular space is open on the lower front of the recharging tube and connects with a protective gas source for the supply of protective gas.

BRIEF DESCRIPTION OF DRAWINGS

The invention permits various specific embodiments. For a further illustration of its basic principle, one of them is represented in the drawings and described below. The drawings show the following in the figures:

FIG. 1 is a vertical section through a crystal pulling unit according to the invention; and FIG. 2 is a schematic representation of the area of a recharging tube of the crystal pulling unit.

DETAILED DESCRIPTION OF INVENTION

In accordance with the invention, is has been observed that the finer, dust-shaped particles in the recharging material adhere, by melting, to the walls of the recharging tube. There, they form an adhesive film, on which later the coarser fractions of the granulate also adhere and melt. This danger of the melting of fine fractions is particularly great with a heated recharging tube, as described by German Patent No. 2,821,481. The annular space and the gas flowing in it provide for a temperature of the inner wall surface of the recharging tube that is lower than that of recharging tubes known up to now, whereby the danger of baking of recharging material is reduced. By means of the annular space of the recharging tube with gas flowing through, in accordance with the invention, a gas mist, which prevents recharging material from entering the pulling space, is formed at the same time around the outlet of the recharging tube.

Since crystal pulling units usually work with argon as the protective gas, the expense for the formation of the gas mist at the exit of the recharging tube is particularly low, if the annular space has a connection with a protective gas source for argon.

The recharging tube can be cooled quite effectively if the annular space is connected with a protective gas source for helium.

For the further reduction of the temperature of the inner wall of the recharging tube, it is useful if the inner wall of the recharging tube, on the side of the annular space, is provided with a matte finish section, on the outside, at least in the lower area.

The danger of clogging of the recharging tube can be countered in a particularly effective manner if a fine-dust separator is interposed in the recharging tube, outside the container. The fine dust adhering to the granulate can be removed by means of such a fine-dust separator, before the granulate enters the recharging tube, so that the actual source of the clogging is eliminated. At the same time, the danger of dust development in the pulling space is reduced by the fine-dust separator.

The fine-dust separator is designed in a particularly simple manner if it is constructed as a pneumatic classifier, working with a protective gas that is inert with respect to the meltable material.

The fine-dust separator could be designed as a pneumatic sifter, in which a fluidized bed is formed over a longer path. In this way, however, the danger arises that dust will be formed in the fine-dust separator by the granulate particles rubbing against one another and by the rubbing of the granulate on the walls of the pneumatic sifter. The danger of formation of additional dust can be avoided if, in accordance with another refinement of the invention, the fine-dust separator has, above one another, an annular nozzle, located around an annular opening for the passage of the meltable material, to supply the protective gas, and coaxially above it has a second annular nozzle to suction off the protective gas. Such a fine-dust separator has the additional advantage that it is constructed in a very compact form and therefore requires little space.

Since crystal pulling units for silicon blocks usually work with argon as the protective gas, it is advantageous if the fine-dust separator also has a connection to work with a protective gas source for argon. A small partial quantity of argon can then be shunted off from the protective gas source for the container holding the crucible.

The granulate particles of the melt can be cooled after passing through the conducted gas in the fine-dust separator at the same time if the fine-dust separator has a connection to work with a protective gas source for helium.

For the further reduction of the baking of finer fractions in the recharging tube, it is useful if the conveyance path of the recharging tube, limited by the inner wall, is also connected with the protective gas source for the production of a flushing gas flow at its upper side.

FIG. 1 shows a closed container 1, in which a crucible 2 made of quartz material is located. A melt 3 of silicon is located in crucible 2 with crystal block 4 being pulled by means of a puller 5 from the melt in a pulling space 22. To this end, the crystal block 4 is rotated about its longitudinal axis, as shown by the arrows, and is uniformly pulled upwards at the rate of the crystal growth.

Outside the container 1, a granulate storage unit 6 is located; from that unit, silicon granulate is supplied to the melt 3 via a recharging tube 7. A fine-dust separator 8 is located outside the container 1 between it and the granulate storage unit 6. The melt 3 can also be supplied with doping material from a doping-material storage unit 9 via the recharging tube 7.

The schematic diagram according to FIG. 2 illustrates the design of the fine-dust separator 8 and the recharging tube 7. The fine-dust separator 8 has an annular opening 10, which is enclosed by two annular nozzles 11,12 located directly above one another. The annular nozzle 11 is connected with an argon protective gas source 13 so that, through the nozzle, argon is able to flow into the annular opening 10; it is suctioned off via the annular nozzle 12 immediately above the annular nozzle 11. For this purpose, the unit has a pump 14 with an upstream dust filter 15. Indicated schematically in FIG. 2 is a conveyor 16, on which the recharging material in the form of a granulate 17 is supplied to the fine-dust separator 8, and from which it falls into the annular opening 10. Within the annular opening 10, this granulate 17 is freed from the dust adhering to it by the gas cushion formed from the argon, so that largely dust-free granulate 17 enters the recharging tube 7, through which it falls into the melt 3.

The recharging tube 7 is constructed with a double wall. It has an annular space 20 between an inner wall 18 and an outer wall 19; the annular space is open on the lower front of the recharging tube 7 and is used to supply protective gas from the protective gas source 13. Since the annular space 20 of the recharging tube 7 is open on the lower front of the recharging tube 7, a gas mist 21 flows out from the recharging tube 7 at this point and prevents the migration of dust particles falling through the recharging tube 7 in a side-wise direction and in this way prevents the entry of dust into the pulling space 22.

It is indicated in FIG. 2 that the conveyance path of the recharging tube 7, limited by the inner wall 18, can also be connected with the protective gas source 13 to produce a flushing gas flow on its upper side. Furthermore, one can see in FIG. 2 that the inner wall 18 and the outer wall 19 of the recharging tube 7 are provided with a matte finish section 23, 24 toward the side of the annular space 20, at least in the lower area on the outside, in order to reduce heat radiation.

Further variations and modifications of the foregoing will be apparent to those skilled in the art and are intended to be encompassed by the claims appended hereto.

German priority application 198 13 453.3 is relied on and incorporated therein by reference.

What is claimed is:

1. A method to prevent clogging of a recharging tube in a crystal pulling unit for production of a crystal block, wherein the crystal pulling unit includes: (a) a crucible for receiving a meltable material from which the crystal block is formed, (b) a container for housing the crucible, (c) a pulling space defined above a level of melted material in the crucible, and (d) a recharging tube leading into the crucible for supplying the meltable material in granulate form to said crucible, the recharging tube having an inner wall and an outer wall, wherein an annular space is defined between the inner wall and the outer wall, the annular space being open on a lower end of the recharging tube and connected with a protective gas source for supplying protective gas in the annular space, wherein the lower end of the recharging tube is formed such that when protective gas introduced into the annular space exits the lower end of the recharging tube, the exiting protective gas flow prevents meltable material from entering into the pulling space, wherein the method comprises:

interposing a fine-dust separator in the recharging tube of the crystal pulling unit, outside the container; and removing fine dust adhering to the granulate by means of said fine-dust separator before the granulate enters the container, so that the fine dust does not adhere to the recharging tube and cause clogging.

2. The method according to claim 1, wherein said fine-dust separator operates as a pneumatic classifier, working with a pneumatic classifier protective gas that is inert with respect to the meltable material.

3. The method according to claim 1, further comprising supplying a fine-dust separator gas to the fine-dust separator through a first annular nozzle, located around an annular opening for passage of the meltable material, and suctioning off the fine-dust separator gas through a second annular nozzle located coaxially above the first annular nozzle.

4. The method according to claim 1, further comprising providing a flushing gas flow in a conveyance path of the recharging tube, wherein the conveyance path is limited by the inner wall of the recharging tube and provides an inlet for allowing the meltable material to enter the container.

5. A crystal pulling unit for production of a crystal block, comprising:

a crucible for receiving a meltable material from which the crystal block is formed, a container for housing the crucible, a pulling space defined above a level of melted material in the crucible, and a recharging tube leading into the crucible for supplying the meltable material in granulate form to said crucible, the recharging tube having an inner wall and an outer wall, wherein an annular space is defined between the inner wall and the outer wall, the annular space being open on a lower end of the recharging tube and connected with a protective gas source for supplying protective gas in the annular space, wherein the lower end of the recharging tube is formed such that when protective gas introduced into the annular space exits the lower end of the recharging tube, the exiting protective gas flow prevents meltable material from entering into the pulling space.

6. The crystal pulling unit according to claim 5, wherein said protective gas source is an argon source.

7. The crystal pulling unit according to claim 5, wherein said protective gas source is a helium gas source.

8. The crystal pulling unit according to claim 5, wherein at least one of the inner wall and the outer wall of the recharging tube are provided with a matte finish section facing the annular space.

9. The crystal pulling unit according to claim 5, wherein at least one of the inner wall and the outer wall of the recharging tube are provided with a matte finish section facing the annular space at least in said lower end.

10. The crystal pulling unit according to claim 5, further comprising a fine-dust separator connected to the recharging tube.

11. The crystal pulling unit according to claim 10, wherein said fine-dust separator is a pneumatic classifier, working with a pneumatic classifier protective gas that is inert with respect to the meltable material.

12. The crystal pulling unit according to claim 11, wherein said fine-dust separator has a first annular nozzle, located around an annular opening for passage of the meltable material, to supply the pneumatic classifier protective gas, and coaxially over said first annular nozzle, a second annular nozzle to suction off the pneumatic classifier protective gas.

13. The crystal pulling unit according to claim 12, wherein said fine-dust separator has a connection for a helium protective gas source.

14. The crystal pulling unit according to claim 12, wherein said fine-dust separator has a connection for an argon protective gas source.

15. The crystal pulling unit according to claim 11, wherein said fine-dust separator has a connection for an arson protective gas source.

16. The crystal pulling unit according to claim 11, wherein said fine-dust separator has a connection for a helium protective gas source.

17. The crystal pulling unit according to claim 10, wherein said fine-dust separator has a first annular nozzle, located around an annular opening for passage of the meltable material, to supply a fine-dust separator protective gas, and coaxially over said first annular nozzle, a second annular nozzle to suction off the fine-dust separator protective gas.

18. The crystal pulling unit according to claim 17, wherein said fine-dust separator has a connection for an argon protective gas source.

19. The crystal pulling unit according to claim 17, wherein said fine-dust separator has a connection for a helium protective gas source.

20. The crystal pulling unit according to claim 10, wherein said fine-dust separator has a connection for an argon protective gas source.

21. The crystal pulling unit according to claim 10, wherein the recharging tube defines a conveyance path for the meltable material, wherein the conveyance path is limited by the inner wall, wherein an upper end of the conveyance path is connected with the protective gas source for providing a flushing gas flow at the upper end of the conveyance path.

22. The crystal pulling unit according to claim 10, wherein said fine-dust separator has a connection for a helium protective gas source.

23. The crystal pulling unit according to claim 5, wherein the inner wall of the recharging tube is maintained at a temperature such that meltable material contacting the recharging tube is not melted inside the recharging tube.

* * * * *